(12) United States Patent
Puntambekar et al.

(10) Patent No.: US 8,803,139 B2
(45) Date of Patent: Aug. 12, 2014

(54) BOTTOM AND TOP GATE ORGANIC TRANSISTORS WITH FLUROPOLYMER BANKED CRYSTALLIZATION WELL

(71) Applicants: Kanan Puntambekar, Chicago, IL (US); Lisa Stecker, Vancouver, WA (US); Kurt Ulmer, Vancouver, WA (US)

(72) Inventors: Kanan Puntambekar, Chicago, IL (US); Lisa Stecker, Vancouver, WA (US); Kurt Ulmer, Vancouver, WA (US)

(73) Assignee: Sharp Laboratories of America, Inc., Camas, WA (US)

( * ) Notice: Subject to any disclaimer, the term of this patent is extended or adjusted under 35 U.S.C. 154(b) by 0 days.

(21) Appl. No.: 13/768,708

(22) Filed: Feb. 15, 2013

(65) Prior Publication Data
US 2014/0054560 A1 Feb. 27, 2014

Related U.S. Application Data

(62) Division of application No. 13/009,806, filed on Jan. 19, 2011, now Pat. No. 8,399,290.

(51) Int. Cl.
*H01L 29/08* (2006.01)
*H01L 51/05* (2006.01)
(52) U.S. Cl.
USPC ............ 257/40; 257/70; 257/E51.006
(58) Field of Classification Search
USPC .................................. 257/40, 70, E51.006
See application file for complete search history.

(56) References Cited

U.S. PATENT DOCUMENTS 6,838,361 B2 * 1/2005 Takeo ..................... 438/493

FOREIGN PATENT DOCUMENTS

| JP | 2010-016280 | * | 1/2010 | ............. H01L 51/05 |
| JP | 2011-003791 | * | 1/2011 | ............. H01L 51/05 |

* cited by examiner

*Primary Examiner* — Minh-Loan T Tran
(74) *Attorney, Agent, or Firm* — Law office of Gerald Maliszewski; Gerald Maliszewski

(57) ABSTRACT

A method is provided for fabricating a printed organic thin film transistor (OTFT) with a patterned organic semiconductor using a fluropolymer banked crystallization well. In the case of a bottom gate OTFT, a substrate is provided and a gate electrode is formed overlying the substrate. A gate dielectric is formed overlying the gate electrode, and source (S) and drain (D) electrodes are formed overlying the gate dielectric. A gate dielectric OTFT channel interface region is formed between the S/D electrodes. A well with fluropolymer containment and crystallization banks is then formed, to define an organic semiconductor print area. The well is filled with an organic semiconductor, covering the S/D electrodes and the gate dielectric OTFT channel interface. Then, the organic semiconductor is crystallized. Predominant crystal grain nucleation originates from regions overlying the S/D electrodes. As a result, an organic semiconductor channel is formed, interposed between the S/D electrodes.

8 Claims, 6 Drawing Sheets

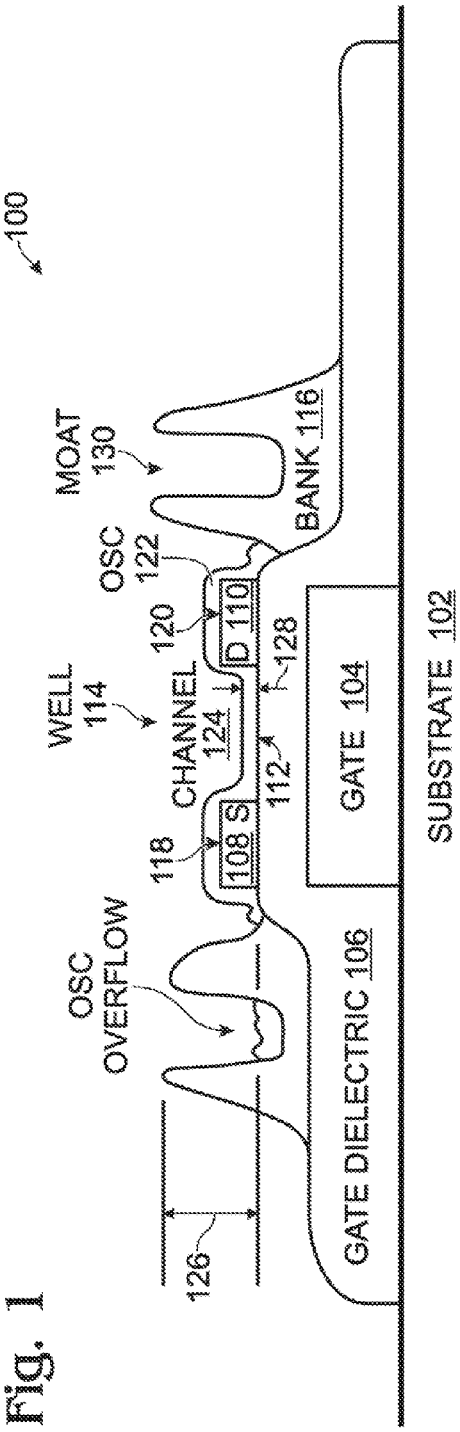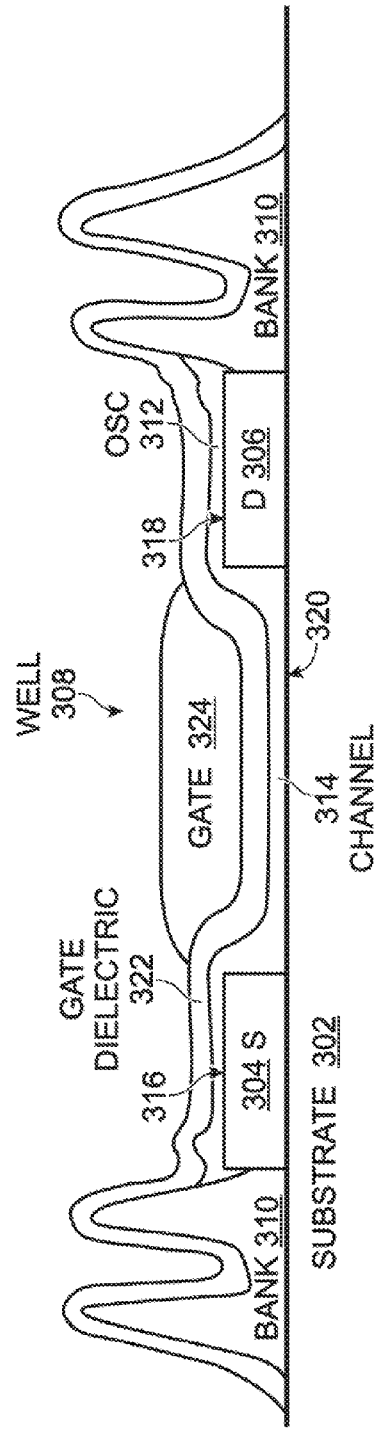

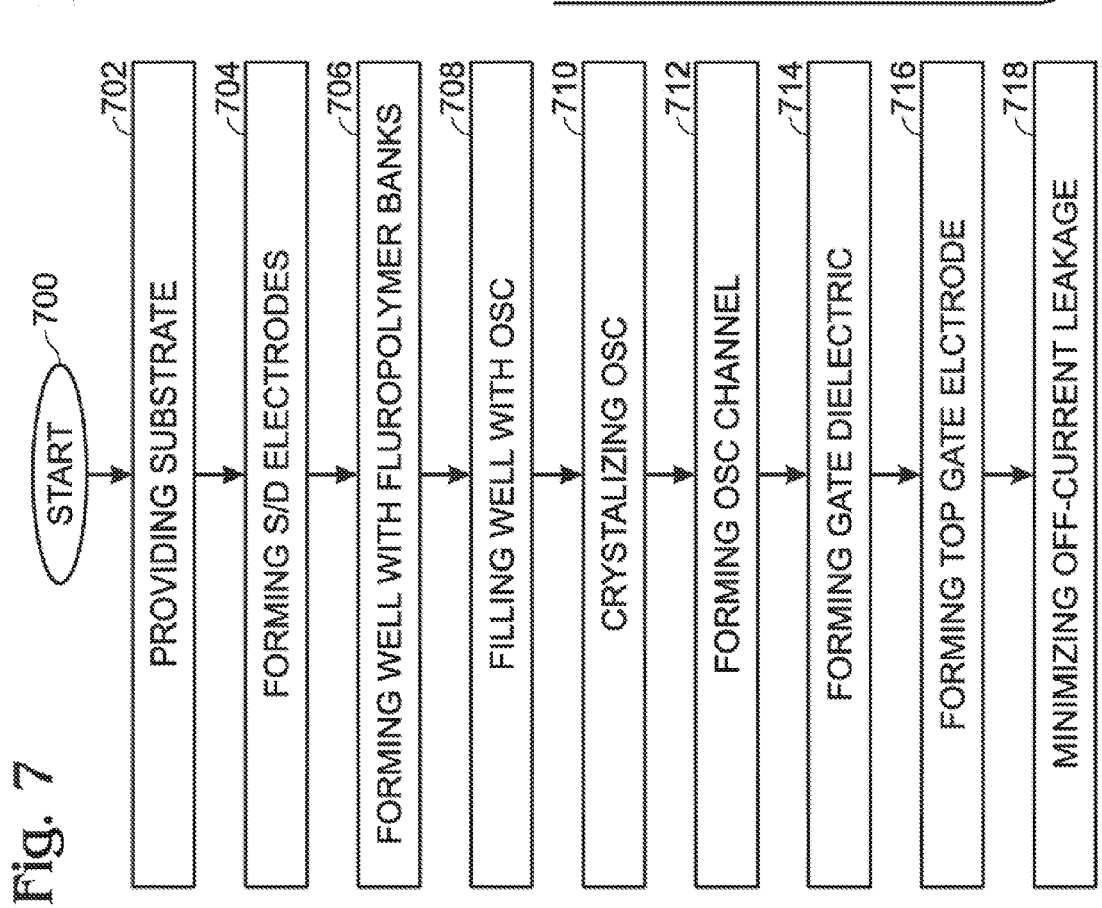

BOTTOM AND TOP GATE ORGANIC TRANSISTORS WITH FLUROPOLYMER BANKED CRYSTALLIZATION WELL

RELATED APPLICATIONS

This application is a Divisional of a patent application entitled, ORGANIC TRANSISTOR WITH FLUROPOLYMER BANKED CRYSTALLIZATION WELL, invented by Lisa Stecker et al., Ser. No. 13/009,806, filed Jan. 19, 2011, and issued as U.S. Pat. No. 8,399,290 on Mar. 19, 2013. This application is incorporated herein by reference.

BACKGROUND OF THE INVENTION

1. Field of the Invention

This invention generally relates to integrated circuit (IC) fabrication and, more particularly, to an organic thin-film transistor (OTFT) fabricated using a fluropolymer that is used as a bank for the purposes of containment and crystallization.

2. Description of the Related Art

As noted in Wikipedia, an organic field-effect transistor (OFET) is a transistor that uses an organic semiconductor in its channel. OTFTs are a type of OFET. OTFTs can be prepared either by vacuum evaporation of small molecules, by solution-casting of polymers or small molecules, or by mechanical transfer of a peeled single-crystalline organic layer onto a substrate. These devices have been developed to realize low-cost, large-area electronic products. OTFTs have been fabricated with various device geometries.

Organic polymers, such as poly(methyl-methacrylate) (PMMA), CYTOP, PVA, polystyrene, parylene, etc., can be used as a dielectric. OFETs employing numerous aromatic and conjugated materials as the active semiconducting layer have been reported, including small molecules such as rubrene, tetracene, pentacene, diindenoperylene, perylenediimides, tetracyanoquinodimethane (TCNQ), and polymers such as polythiophenes (especially poly 3-hexylthiophene (P3HT)), polyfluorene, polydiacetylene, poly 2,5-thienylene vinylene, poly p-phenylene vinylene (PPV). These can be deposited via vacuum or solution base methods, the later being of interest for printed electronics. The newer generation of solution processable organic semiconductors consists of blends of high performance small molecule and polymeric molecules for optimum performance and uniformity.

FIG. 8 is a plan view photograph of an OSC ink material deposited without the benefit of containment banks (prior art). A specific example of an organic semiconductor material in a bottom gate OTFT is shown. Since the OSC print does not have any bank control, edge pinning and nucleation of the grains from the edges result, leading to varying grain size and non-uniform grain growth in the channel. In addition to the containment of the OSC ink, it is also important to have some control over the crystallization in this layer as the solvent evaporates. Lack of OSC containment leads to the inability to form orthogonal geometries due to surface tension dynamics. Typically, a deposited OSC ink begins drying first at the print area edges and the OSC grains nucleate from these edges. As a result, a roughly circular print area is obtained, regardless of the target print geometry, where the crystallization starts at the edges and proceeds inwards in the print area. Since more solvent is driven to the edges, higher grain sizes are obtained at the edges with increasing non-uniformity closer to the center. Such non-uniform and unpredictable grain growth is highly undesirable.

In most formulations the solvents being used are volatile enough that they start drying immediately after printing, before the anneal step. This drying leads to what is typically termed as a "coffee stain" effect in case of inkjet printing resulting from edge pinning and preferential drying at the print edges. This effect causes a solvent flow from the interior regions of the print area to the edges (convective flow). There are some examples in the literature showing that the addition of certain solvents can reverse this flow (termed Marangoni flow) to some extent. In the case of polymeric systems, which mostly form amorphous films, the coffee stain effect only leads to variations in the thickness of the film from edge to center. However in case of small molecule systems, which are crystallized to form polycrystalline films, there is added complication of the nucleation and grain growth in the film that has to be controlled. Since the print edges tend to dry first, there is a spontaneous tendency for grain nucleation at the edges. As further material is drawn from the interior regions of the print area, the grain growth proceeds towards the center of the print area.

This situation poses two main problems. If the surface tension of the substrate forces the formulation into a large nearly circular geometry (as shown), then it is not possible to print very small OSC features. If the volume dispensed is spread over a large area, then the large spread leads to inadequate volume for large grain growth through the entire print area—leading to small grains in the middle of the print area where the OTFT channel is defined.

In the case of printed small molecule OTFTs, the morphology and patterning of the organic semiconductor (OSC) layer is a challenging problem. Two key areas of research involve optimization of the grain growth in the OTFT channel region and isolation of the channel region of the device from the surrounding areas. Organic printed electronics rely on the ability to solution process and/or print each of the TFT layers. Inkjet (IJ) printing is commonly used to print the organic semiconductor layer. For a successful IJ print of the OSC layer, the solution and the surface energy must be optimized over a large area to control the extent of the OSC drop spread and uniformity of the drop. This is essential to insure the consequent morphology is as desired and consistent from device to device. A common way of addressing this issue has been to use so-called bank structures—which is an additional layer that is deposited and patterned in order to create a well structure. The organic semiconductor material is contained by jetted material only into a raised moat region of the coffee stain. The bank material restricts the drop spread and also helps maintain the solution uniformly over the well area. As a result, the process allows for a consistent film thickness and morphology uniformity with controlled drop drying.

The printing community has been using different methods of fabricating bank structures. The concept of using fluropolymer materials as an aid in fabrication has been explored to some extent in previous works. For example, in U.S. Pat. No. 6,838,361, a printed hydrophobic layer is used (with fluropolymer as example of such layer) to create a separation between two printed metal lines, but not necessarily to contain the metal print within certain area. These two metal lines, separated by the fluropolymer, then serve as the source/drain electrodes for a TFT. However, in order for this concept to work, the bank layer must be removed after the metal layer deposition using a plasma process. This removal process puts limitations on the types of material surfaces that can be used. Especially in the case of a bottom gate organic TFT, any plasma step used to remove the bank layer can have detrimental effect on the underlying organic gate insulator layer. The plasma step can also oxidize or otherwise damage the metal S/D interfaces.

Another method using fluropolymers is the deposition of a blanket layer (or dual layers), with patterning using standard lithographic techniques, see US 2007/0193978A1, WO2009077738A1, WO2010020790A1, and WO2009112569A1. The challenge to these approaches is to ensure that the bank material develops cleanly over the organic gate insulator and the metal source drain electrodes, while still not causing any damage to these structures in the development process.

Gundlach et al., "Contact-Induced Crystallinity for High-Performance Soluble Acene-Based Transistors and Circuits", use a different approach to address the containment issue. In that work they preferentially coat the S/D electrodes with self-assembled monolayers and then blanket coat an OSC film. Large OSC grain growth nucleates only on these electrodes and then bridges the channel for high performance OTFTs. However, poor grain growth outside the channel area is used as a means to provide for good device isolation. This concept works only to a limited extent, with off currents>nA (nanoamps), and is not reasonable for scaling and application in practical products.

It would be advantageous if a banking structure could be deposited using an inkjet process, to contain OSC deposition, without the requirement of lithographically patterning the bank.

It would be advantageous if the above-mentioned banking structure could be left in place after device fabrication.

It would be advantageous if the above-mentioned banking structure aided in the crystallization of the deposited OSC material.

SUMMARY OF THE INVENTION

Described herein is a simple and effective way of creating bank structures for small molecule organic semiconductor systems using fluropolymer ink jet printing. Fluropolymers are ideal for solvent orthogonality, creating a large surface energy contrast in order to control the OSC ink spread without contaminating the OSC formulation. The OSC formulations are typically non-polar solvent based and, thus, the fluorinated solvent based systems provide good solvent orthogonality. For the same reason, fluropolymers are commonly used as a gate insulator for top gate organic TFTs. Also, the ability to form fluropolymer banks via direct inkjet printing, as opposed to a deposition and patterning processes, makes it possible to integrate these structures within bottom gate process flows without any additional concerns regarding its affect on the printed source-drain and gate insulator layers.

In addition to the containment of the OSC ink, it is also important to have some control over the OSC crystallization as the solvent evaporates. The use of fluropolymer banking around the OSC print area, in tandem with source-drain metal electrodes, reduces or eliminates the tendency of print edge nucleated grain growth, and drives source-drain mediated systematic grain growth in the channel region. It should be noted however that the above-described banking concept is not limited to any particular material systems and is widely applicable provided the formulations and geometries are tuned appropriately.

Accordingly, a method is provided for fabricating an organic thin film transistor (OTFT) with a fluropolymer banked crystallization well, in the case of a bottom gate OTFT, a substrate is provided and a gate electrode is formed overlying the substrate. A gate dielectric is formed overlying the gate electrode, and source (S) and drain (D) electrodes are formed overlying the gate dielectric. A gate dielectric OTFT channel interface region is formed between the S/D electrodes. A well with fluropolymer containment and crystallization banks is then formed, to define an organic semiconductor print area. The well is filled with an organic semiconductor, covering the S/D electrodes and the gate dielectric OTFT channel interface. Then, the organic semiconductor is crystallized. Predominant crystal grain nucleation originates from regions overlying the S/D electrodes. In one aspect the organic semiconductor crystal grains are formed in the OTFT channel region with a length that extends between the source electrode and the drain electrode. As a result, an organic semiconductor channel is formed, interposed between the S/D electrodes.

Additional details of the above-described method, a method for fabricating a top gate OTFT, a bottom gate OTFT device, and a top gate OTFT device are provided below.

BRIEF DESCRIPTION OF THE DRAWINGS

FIG. 1 is a partial cross-sectional view of a bottom gate organic thin film transistor (OTFT) with a fluropolymer banked crystallization well.

FIG. 3 is a partial cross-sectional view of a top gate OTFT with a fluropolymer banked crystallization well.

FIG. 7 is a flowchart illustrating a method for fabricating a top gate OTFT with a fluropolymer banked crystallization well.

FIG. 8 is a plan view photograph of an OSC ink material deposited without the benefit of containment banks (prior art).

DETAILED DESCRIPTION

Figure 2:
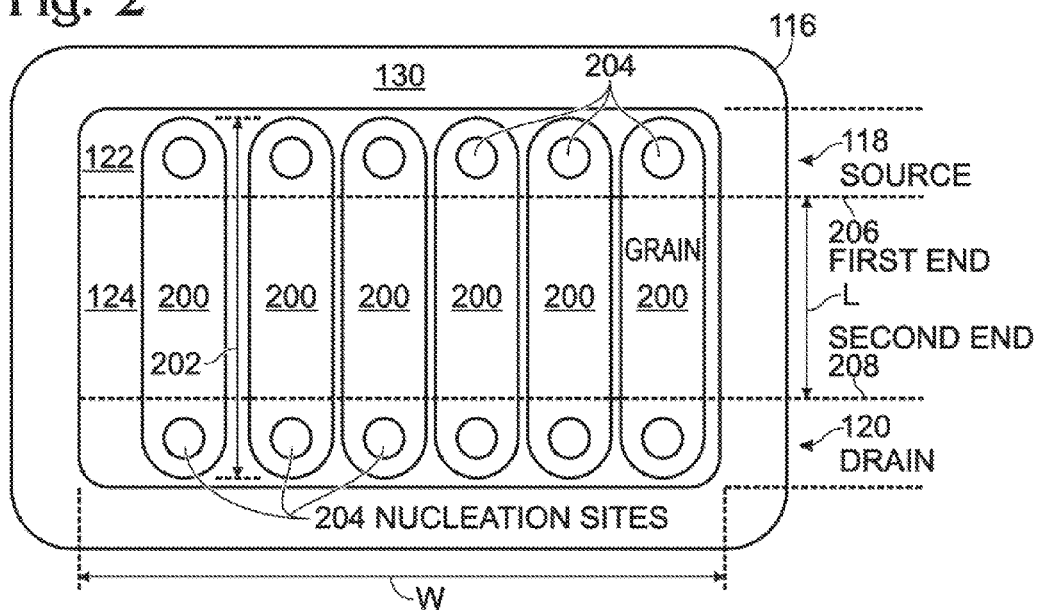
FIG. 2 is a plan view depicting the organic semiconductor layer of FIG. 1.

FIG. 1 is a partial cross-sectional view of a bottom gate organic thin film transistor (OTFT) with a fluropolymer banked crystallization well. The bottom gate OTFT 100 comprises a substrate 102 made from a quartz, glass, plastic, or semiconductor material. A gate electrode 104 overlies the substrate 102, made from a metal or doped semiconductor material. A gate dielectric 106 overlies the gate electrode 104, typically made from an oxide, nitride, or organic gate insulator. A source (S) electrode 108 and a drain (D) electrode 110 overlie the gate dielectric 106, exposing a gate dielectric channel interface region 112 between the S/D electrodes. Typically, the source 108 and drain 110 electrodes are a metal. A well 114 with fluropolymer containment and crystallization banks 116 forms a print area surrounding the gate dielectric channel interface, and at least a portion of the source 108 and drain 110 electrodes. The print area is defined as the gate dielectric channel interface region 112, the top surface 118 of the source electrode 108, and the top surface 120 of the drain electrode 110. A crystallized organic semiconductor layer 122 with a channel 124 overlies the gate dielectric channel interface 112. Note that the drawing is not to scale.

FIG. 2 is a plan view depicting the organic semiconductor layer 122 of FIG. 1. The crystallized organic semiconductor layer 122 includes crystal grains 200 with lengths 202 that extend between the source electrode 108 and the drain electrode 110. Nucleation origin sites 204 overlie the S/D electrodes 108/110, which are depicted in phantom. The channel 124 has a first end 206 adjacent the source 108 and a second end 208 adjacent the drain 110, with crystal grains 200 extending between the channel first and second ends 206/208, bridging the channel 124.

Returning to FIG. 1, the fluropolymer containment and crystallization banks 116 have a height 126 with respect to a gate dielectric channel interface 112. The crystallized organic semiconductor layer 122 has a thickness 128 that can be less than, equal, or greater than the height of the fluropolymer containment and crystallization banks 116. As shown, the crystallized OSC layer 122 thickness 128 is less than height 126. The fluropolymer containment and crystallization banks 116 are a coffee stain remnant of an inkjet-deposited fluropolymer material, forming a ring with a raised moat 130. The moat 130 can be used to collect OSC overflow.

Returning to FIG. 2, it can be seen that the fluropolymer banks 116 form a rectangular ring with a raised moat 130. As a result of an inkjet deposition process, the hank structures 116 can be printed such that they provide a large coffee stain at the edge of the banks, which provide a physical harrier in addition to a surface energy harrier to control the OSC ink spread.

As described in more detail below, the surface energy contrast between the fluropolymer containment and crystallization banks 116 and the gate dielectric channel interface 112 forms a water contact angle on the fluropolymer containment and crystallization banks that is greater than about 40° of the water contact angle formed on the gate dielectric channel interface.

FIG. 3 is a partial cross-sectional view of a top gate OTFT with a fluropolymer banked crystallization well. The top gate OTFT 300 comprises a substrate 302, with source (S) 304 and drain (D) 306 electrodes overlying the substrate 302. A well 308 with fluropolymer containment and crystallization banks 310 overlies the source 304 and drain 306 electrodes, defining a print area. A crystallized organic semiconductor layer 312 at least partially fills the well 308, with a channel 314 interposed between the source 304 and drain 306 electrodes. The print area is defined as the top surface 316 of the source electrode 304, the top surface 318 of the drain electrode 306, and a substrate interface surface 320 interposed between the source and drain. A gate dielectric 322 overlies the channel 314 and a (top) gate electrode 324 overlies the gate dielectric 322. Details of the top gate OTFT are similar those described above for the bottom gate OTFT, and are not repeated here in the interest of brevity.

Functional Description

In order to illustrate the above-described devices, an example is presented of an actual small molecule organic semiconductor based bottom gate organic transistor, as measured in the laboratory. However, it should be understood that the devices are not limited to the explicit structure or material systems used in the example. In this particular example, an organic insulator or OGI, organic semiconductor, Dupont fluropolymer bank (AF1600), and evaporated metal layers are used.

In order to select a particular bank material it is important to determine the extent of surface energy contrast that can be obtained. A common method of performing this task is to contrast the water contact angle on the organic gate insulator material in the channel region with the water contact angle on the bank region. However, this method does not necessarily provide an accurate assessment for the OSC print case since the base solvent for these inks tend to be non-polar solvents. So in order to obtain the surface energy contrast of the OSC formulation for the bank material, the contact angle of the OSC formulation for one particular organic gate insulator surface was compared to different bank material candidates. Since any surface treatments can also change the surface energy drastically, these measurements were performed on surfaces after appropriate surface treatment steps. The table below lists different fluropolymers that show a high contrast useful in bank materials.

TABLE 1

As seen in the table, the AF1600 fluropolymer material provides a large contrast of ~40° with respect to the organic gate insulator surface (the UV cross-linked OGI), with the organic

| | Material | Dilution | H2O As Dep | H2O Post Plasma | H2O Plasma + SAM* | Organic semiconductor solvent As Dep | Organic semiconductor solvent Post Plasma | Organic semiconductor solvent Plasma + SAM* |
|---|---|---|---|---|---|---|---|---|
| OGI ← | UV cross-linked OGI | None | 76° | | 43° | 0° | 13° | 16° |
| Bank ← | Fluropolymer OGI | None | 115° | 80° | 88° | 52° | 24° | 24° |
| | AF1600 fluropolymer | 1:5 | 119° | 92° | 112° | 63° | 46° | 56° |
| | Cytop | 1:2 | | | | 55° | | | semiconductor formulation as the contact angle drop. But the table also shows that measuring only water contact angle can be misleading. A different fluropolymer system than the AF1600 ("fluropolymer OGI" in Table 1) with the same organic semiconductor solvent is barely 10 degrees different than organic gate insulator surface, even though the CA contrast with water is much higher (~45 degrees).

Figure 4A:
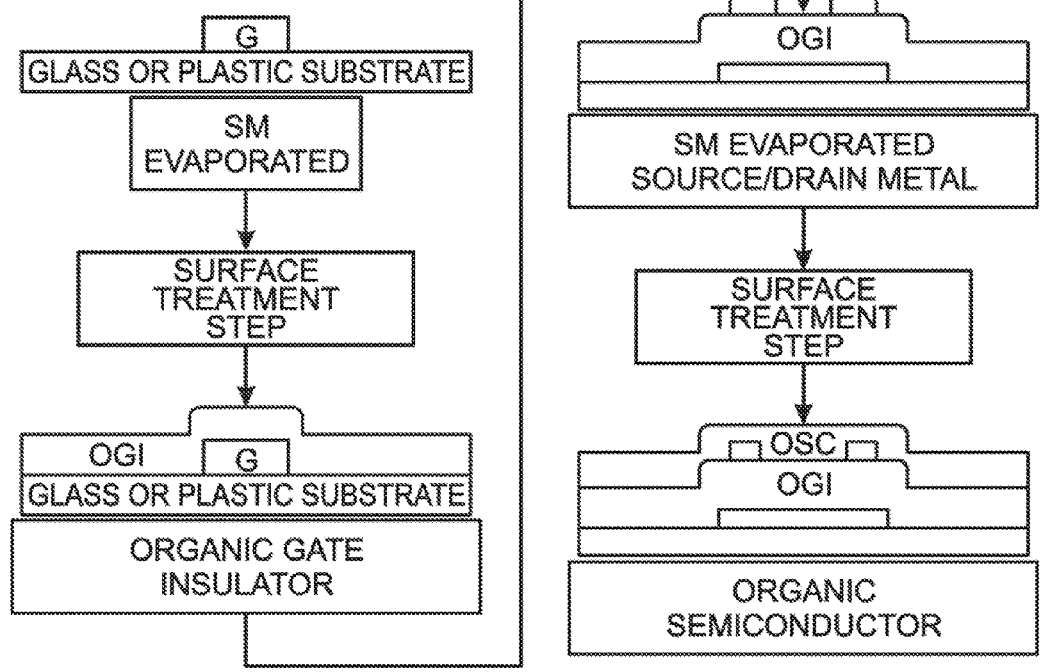
FIGS. 4A and 4B highlight steps in the process flow of fabricating a bottom gate OTFT.
Figure 4B:
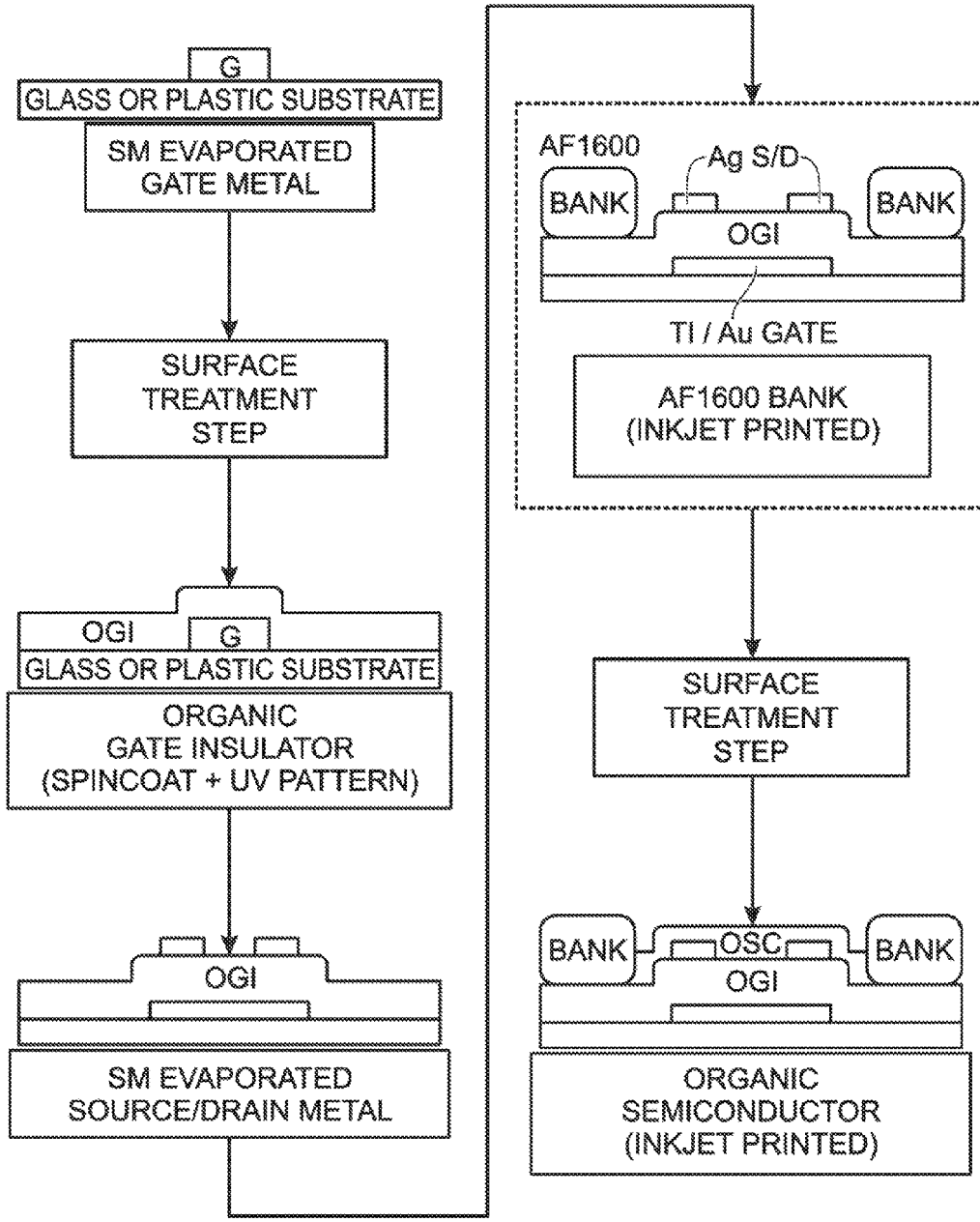

FIGS. 4A and 4B highlight steps in the process flow of fabricating a bottom gate OTFT. FIG. 4A shows the process without using bank structures and FIG. 4B shows the process flow with bank print integration.

Figure 5A:
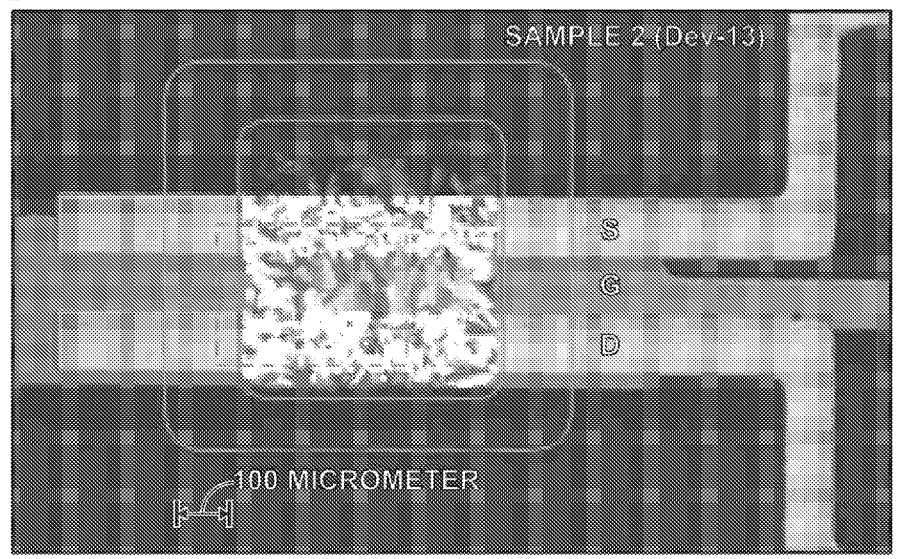
FIG. 5A is a photograph depicting a plan view of the above-described OTFT showing the OSC film confined within the bank area.
Figure 5B:
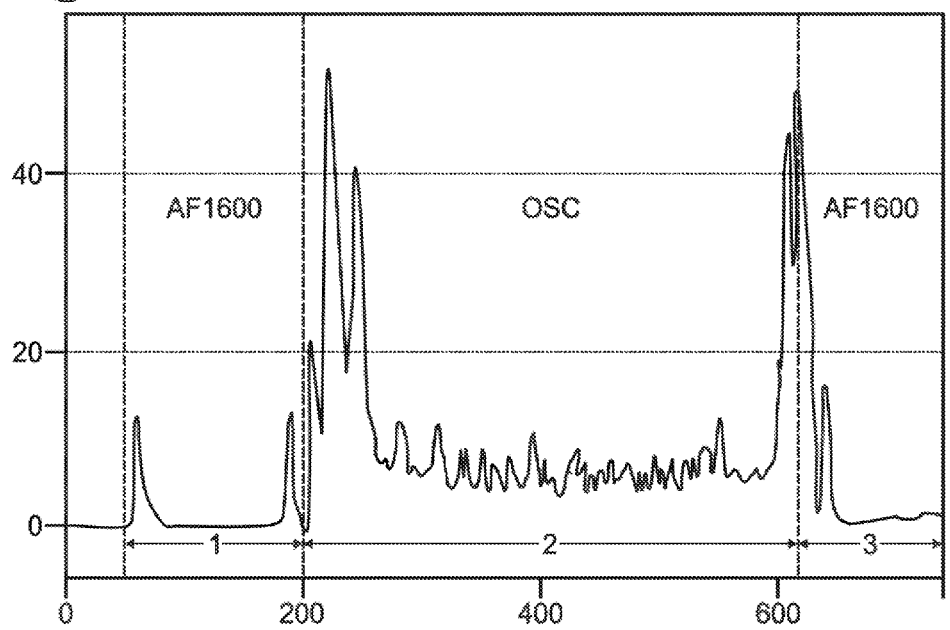
FIG. 5B is profilometry data.

FIG. 5A is a photograph depicting a plan view of the above-described OTFT showing the OSC film confined within the bank area. FIG. 5B is profilometry data. The film of FIG. 5A is highlighted using polarization contrast on the optical microscope. The boundary highlights the edges of the bank print that are not visible in this contrast.

Significant coffee rings as shown in profilometry data of FIG. 5B. However, the OSC print area has an even higher coffee ring height than the banks. The fact that the OSC film produced higher coffee stains than the hank print shows the ability of the bank material to confine large quantities of the OSC material effectively. The OSC material is contained by differences in surface energy as well as banking material acting as a physical barrier.

The ability to contain large volumes of OSC in the bank area enables good uniform grain growth in the OSC film throughout the printed area. In contrast, when unbanked, there is a lack of control over the OSC ink spread, resulting in not only a large area print but also an OSC film with highly non-uniform grain growth.

In the case of inkjet printed small molecule organic semiconductor systems, it is challenging to control the grain growth in the OSC film as the solvent dries. In most of these formulations, the solvents being used are volatile enough that they start drying immediately after the print and even before the anneal step. This leads to what is typically termed as a "coffee stain" effect in case of inkjet printing resulting from edge pinning and preferential drying at the print edges. This effect causes a solvent flow from the interior regions of the print area to the edges (convective flow). In case of polymeric systems, which mostly form amorphous films, the coffee stain effect only leads to variations in the thickness of the film from edge to center. However in case of small molecule systems, which are crystallized to form polycrystalline films, there is added complication of the nucleation and grain growth in the film that has to be controlled. Since the print edges tend to dry first, there is a spontaneous tendency for grain nucleation at these edges. As further material is drawn from the interior regions of the print area, the grain growth proceeds towards the center of the print area, as shown in FIG. 8.

This situation poses two main problems. If the surface tension of the substrate is such that it forces the formulation into a large nearly circular geometry, then it is not possible to print very small OSC features. If the volume is widely dispensed, then the large spread leads to inadequate volume for large grain growth through the entire print area leading to small grains in the middle of the print area where the OTFT channel is defined. In the case where the OSC material is banked it is still important to be able to control the nucleation and grain growth. The source-drain electrodes provide preferential nucleation sites. With a larger volume of OSC constrained in the print area, drying is effectively slowed at the edges, so that S/D nucleated grain nucleation is the dominant nucleation and grain, growth mechanism. As a result, the final film morphology is more uniform in the channel regions. This grain growth can be controlled to some extent by tuning the OUT channel length (L).

Grain growth is tailored in the OTFT channel by altering the channel length, which is the gap between the printed source-drain electrodes. The assumption is provisionally made that all device dimensions and process parameters are identical and only the W (distance between bank well edges, see FIG. 2) and L are modified. If indeed the grain growth is controlled by the S/D electrodes interfaces then for small channel lengths some or all of the grains bridge the entire channel resulting in the highest mobilities. As L increases, the grains are likely to nucleate at both ends of the channel, grow inwards, and result in a grain boundary in the interior of the channel region. This would result in degradation of the device mobility. Further an increase in L can result in a dimensional range where the grain growth in the channel is a random network of grain boundaries where some grain nucleate in the interior of channel in addition to in the S/D regions. This result would further degrade mobility. However, one would also expect the uniformity to improve with increasing L, for the same reasons that the overall mobility would degrade.

The validity of this hypothesis is demonstrated in the measured results presented in Table 2. The table indicates that the trend as a function of L is indeed as expected. Using three devices having a W~475 um (microns), the microstructure in the channel region is observed as a function of L. On an average, an increase in grain boundary density is observed with increasing L. For L~23 um, there is a combination of cases where one or two grains bridge the channel length along different regions of W. However, the trend towards at least 2 grains along L at different points in. W increases for the L~60 um. For even higher L~105 um, there is systematic grain boundary edge in the middle of the channel length along all regions of channel W.

TABLE 2

| | Mobility ($cm^2/Vs$) | | | |
| --- | --- | --- | --- | --- |
| | W (um) | | | |
| | 300 | | 475 | |
| L | Average | Std. Dev. | Average | Std. Dev. |
| 23 | 0.15 | 0.04 | 0.27 | 0.1 |
| 60 | 0.08 | 0.03 | 0.19 | 0.06 |
| 105 | 0.03 | 0.02 | 0.09 | 0.04 |

Figure 6:
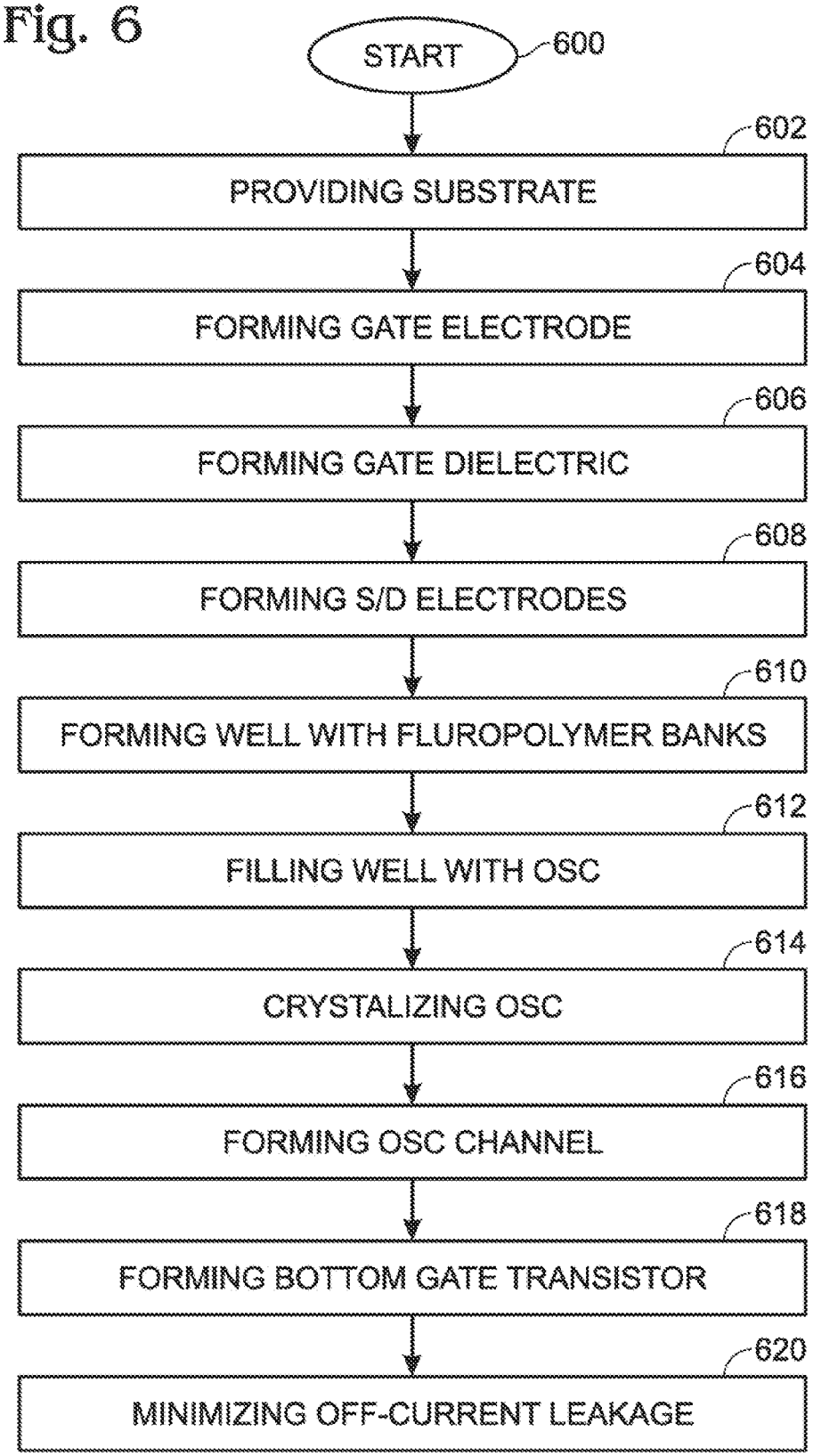
FIG. 6 is a flowchart illustrating a method for fabricating a bottom gate OTFT with a fluropolymer banked crystallization well.

FIG. 6 is a flowchart illustrating a method for fabricating a bottom gate OTFT with a fluropolymer banked crystallization well. Although the method is depicted as a sequence of numbered steps for clarity, the numbering does not necessarily dictate the order of the steps. It should be understood that some of these steps may be skipped, performed in parallel, or performed without the requirement of maintaining a strict order of sequence. Generally however, the method follows the numeric order of the depicted steps. The method starts at Step 600.

Step 602 provides a substrate. Step 604 forms a gate electrode overlying the substrate. Step 606 forms a gate dielectric overlying the gate electrode. Step 608 forms source (S) and drain (D) electrodes overlying the gate dielectric, and a gate dielectric OTFT channel interface region between the S/D electrodes. Step 610 forms a well with fluropolymer containment and crystallization banks, to define an organic semiconductor print area. Step 612 fills the well with an organic semiconductor, covering the S/D electrodes and the gate dielectric OTFT channel interface. For example, the well can be filled with an organic semiconductor includes using an inkjet process.

Subsequent to filling the well, Step 614 crystallizes the organic semiconductor. For example, the device can be furnace or laser annealed, Step 616 forms an organic semiconductor channel interposed between the S/D electrodes. Subsequent to forming the organic semiconductor channel, Step 618 forms a bottom gate transistor with fluropolymer containment and crystallization banks. In response to defining the organic semiconductor print area within the fluropolymer containment and crystallization banks, Step 620 minimizes off-current leakage.

In one aspect, crystallizing the organic semiconductor in Step 614 includes predominant crystal grain nucleation originating from regions overlying the S/D electrodes. In another aspect, Step 614 forms organic semiconductor crystal grains in the OTFT channel region with a length that extends between the source electrode and the drain electrode. In yet another aspect, Step 616 forms the organic semiconductor channel with a length, a width, and an interior region. Then, Step 614 forms two independent grain growth fronts from the source and drain electrodes that grow along the length of the channel and meet in the interior region of the channel, forming a systematic single grain boundary front that runs through at least a partial width of the channel.

In one aspect, forming the well with fluropolymer containment and crystallization banks in Step 610 includes forming a predefined print area. Then, filling the well with the organic semiconductor in Step 612 includes forming a predefined area of deposited organic semiconductor material between the fluropolymer containment and crystallization banks.

in one aspect, forming the well with fluropolymer containment and crystallization banks in Step 610 includes using an inkjet printing process to form the fluropolymer containment and crystallization banks as coffee-stain rings with a raised moat. Then, filling the well with the organic semiconductor in Step 612 includes catching overfill organic semiconductor in the coffee-stain raised moat, in the event of deposition misalignment.

FIG. 7 is a flowchart illustrating a method for fabricating a top gate OTFT with a fluropolymer banked crystallization well. The method begins at Step 700. Step 702 provides a substrate. Step 704 forms source (S) and drain (D) electrodes overlying the substrate, defining a channel interface surface in the substrate between the source and drain electrodes. Step 706 forms a well with fluropolymer containment and crystallization banks surrounding the source electrode, drain electrode, and a substrate interface surface interposed between the source and drain electrodes, defining an organic semiconductor print area. Step 708 fills the well with an organic semiconductor. Step 710 crystallizes the organic semiconductor. Step 712 forms an OTFT channel in the organic semiconductor overlying the channel interface surface between the S/D electrodes, Step 714 forms a gate dielectric overlying the OTFT channel, and Step 716 forms a top gate electrode overlying the gate dielectric. In response to defining the organic semiconductor print area within the fluropolymer containment and crystallization banks, Step 718 minimizes off-current leakage.

A method has been provided for fabrication OTFT devices using a fluropolymer containment banks. Examples of particular structures, process flows, and materials have been presented to illustrate the invention. However, the invention is not limited to merely these examples. Further, materials other than fluropolymer can be used as containment structures. Other variations and embodiments of the invention will occur to those skilled in the art.

We claim:

1. A bottom gate organic thin film transistor (OTFT) with a fluropolymer banked crystallization well, the OTFT comprising:
a substrate;
a gate electrode overlying the substrate;
gate dielectric overlying the gate electrode;
source (S) and drain (D) electrodes overlying the gate dielectric, exposing a gate dielectric channel interface region between the S/D electrodes;
a well with fluropolymer containment and crystallization banks forming a print area surrounding the gate dielectric channel interface; and,
a crystallized organic semiconductor layer with a channel overlying the gate dielectric channel interface.

2. The OTFT of claim 1 wherein the crystallized organic semiconductor layer includes crystal grains with lengths that extend between the source electrode and the drain electrode.

3. The OTFT of claim 1 wherein the crystallized organic semiconductor layer includes nucleation origin sites overlying the S/D electrodes.

4. The OTFT of claim 1 wherein the organic semiconductor layer includes a channel with a first end adjacent the source and a second end adjacent the drain, with crystal grains extending between the channel first and second ends, bridging the channel.

5. The OTFT of claim 1 wherein the fluropolymer containment and crystallization banks have a height with respect to a gate dielectric channel interface; and,
wherein the crystallized organic semiconductor layer has a thickness selected from a group consisting of less than, equal, and greater than the height of the fluropolymer containment and crystallization banks.

6. The OTFT of claim 5 wherein a surface energy contrast between the fluropolymer containment and crystallization banks and the gate dielectric channel interface forms a water contact angle on the fluropolymer containment and crystallization banks that is greater than about 40° of the water contact angle formed on the gate dielectric channel interface.

7. The OTFT of claim 1 wherein the fluropolymer containment and crystallization banks are a coffee stain remnant of an inkjet-deposited fluropolymer material, forming a ring with a raised moat.

8. A top gate organic thin film transistor ( )) with a fluropolymer banked crystallization well, the OTFT comprising:
a substrate;
source (S) and drain (D) electrodes overlying the substrate;
a well with fluropolymer containment and crystallization banks overlying the source and drain electrodes, defining a print area;
a crystallized organic semiconductor layer at least partially filling the well, with a channel interposed between the source and drain electrodes;
a gate dielectric overlying the channel; and,
a gate electrode overlying the gate dielectric.

* * * * *

UNITED STATES PATENT AND TRADEMARK OFFICE
CERTIFICATE OF CORRECTION

| | | |
|---|---|---|
| PATENT NO. | : 8,803,139 B2 | |
| APPLICATION NO. | : 13/768708 | |
| DATED | : August 12, 2014 | |
| INVENTOR(S) | : Kanan Puntambekar et al. | |

It is certified that error appears in the above-identified patent and that said Letters Patent is hereby corrected as shown below:

In the Specification

Column 6, lines 32 - 43, a portion of the text appears as the heading of Table 1. Further, the circled number in the Table are in the units of degrees. The text and Table should be printed as follows:

As seen in the table, the AF1600 fluropolymer material provides a large contrast of ~ 40° with respect to the organic gate insulator surface (the UV cross-linked OGI), with the organic

| | | | H2O | | | Organic semiconductor solvent | | |
|---|---|---|---|---|---|---|---|---|
| | Material | Dilution | As Dep | Post Plasma | Plasma + SAM* | As Dep | Post Plasma | Plasma + SAM* |
| OGI | UV cross-linked OGI | None | 76° | | 43° | 0° | 13° | 16° |
| Bank | Fluropolymer OGI | None | 115° | 80° | 88° | 52° | 24° | 24° |
| Bank | AF1600 fluropolymer | 1:5 | 119° | 92° | 112° | 63° | 46° | 56° |
| | Cytop | 1:2 | | | | 55° | | |

In the Claims

Claim 8, column 10, line 38, "organic thin film transistor ( ))" should read as "organic thin film transistor (OTFT)".

Signed and Sealed this
Seventh Day of October, 2014

Michelle K. Lee
*Deputy Director of the United States Patent and Trademark Office*